US010453655B2

(12) United States Patent
Kobayashi et al.

(10) Patent No.: US 10,453,655 B2
(45) Date of Patent: Oct. 22, 2019

(54) PLASMA REACTOR HAVING DIGITAL CONTROL OVER ROTATION FREQUENCY OF A MICROWAVE FIELD WITH DIRECT UP-CONVERSION

(71) Applicant: Applied Materials, Inc., Santa Clara, CA (US)

(72) Inventors: Satoru Kobayashi, Santa Clara, CA (US); Hideo Sugai, A'ichi (JP); Soonam Park, Sunnyvale, CA (US); Kartik Ramaswamy, San Jose, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/213,978

(22) Filed: Dec. 7, 2018

(65) Prior Publication Data
US 2019/0108981 A1 Apr. 11, 2019

Related U.S. Application Data

(63) Continuation of application No. 14/974,376, filed on Dec. 18, 2015, now Pat. No. 10,153,133.

(60) Provisional application No. 62/153,688, filed on Apr. 28, 2015, provisional application No. 62/136,737, filed on Mar. 23, 2015.

(51) Int. Cl.
*H01J 37/32* (2006.01)
(52) U.S. Cl.
CPC .... *H01J 37/32192* (2013.01); *H01J 37/3222* (2013.01); *H01J 37/32302* (2013.01); *H01J 37/32311* (2013.01)

(58) Field of Classification Search
CPC ............ H01J 37/32192; H01J 37/3222; H01J 37/32302; H01J 37/32311; H01J 37/32174; H01J 37/32183; H01J 37/32201; H01J 37/32431; H01J 37/32082; H01J 37/32091; H01L 21/32136; H01L 21/6779; H01L 21/6719; H05B 2206/044; H05B 6/6402; H05B 6/68; C23C 16/505
See application file for complete search history.

(56) References Cited

U.S. PATENT DOCUMENTS

| 4,630,566 A | 12/1986 | Asmussen |
| 5,230,740 A | 7/1993 | Pinneo |

(Continued)

FOREIGN PATENT DOCUMENTS

| CN | 101176184 A | 5/2008 |
| CN | 101243534 A | 8/2008 |

(Continued)

OTHER PUBLICATIONS

U.S. Appl. No. 15/180,425, Unpublished (filed Jun. 13, 2016) (Satoru Kobayashi, et al., inventor).

(Continued)

*Primary Examiner* — Haissa Philogene
(74) *Attorney, Agent, or Firm* — Fish & Richardson P.C.

(57) ABSTRACT

A plasma reactor for processing a workpiece has a microwave source with a digitally synthesized rotation frequency using direct digital up-conversion and a user interface for controlling the rotation frequency.

16 Claims, 13 Drawing Sheets

(56) References Cited

U.S. PATENT DOCUMENTS

| | | | |
|---|---|---|---|
| 5,292,370 A * | 3/1994 | Tsai | H01J 37/32082 118/715 |
| 6,494,955 B1 | 12/2002 | Lei et al. | |
| 6,741,944 B1 * | 5/2004 | Verdeyen | H01J 37/32266 702/108 |
| 6,908,846 B2 * | 6/2005 | McMillin | H01J 37/32963 257/758 |
| 7,037,813 B2 * | 5/2006 | Collins | H01J 37/32082 438/151 |
| 7,206,210 B2 | 4/2007 | Harnett et al. | |
| 7,227,097 B2 | 6/2007 | Kumar | |
| 7,477,711 B2 | 1/2009 | Kalvaitis et al. | |
| 8,518,162 B2 | 8/2013 | Smith et al. | |
| 8,766,719 B2 | 7/2014 | Radiou et al. | |
| 9,267,739 B2 | 2/2016 | Chen et al. | |
| 9,299,537 B2 | 3/2016 | Kobayashi | |
| 9,299,538 B2 | 3/2016 | Kobayashi | |
| 9,621,286 B2 | 4/2017 | Earls | |
| 10,153,133 B2 * | 12/2018 | Kobayashi | H01J 37/32192 |
| 2003/0136520 A1 | 7/2003 | Yudovsky et al. | |
| 2006/0021980 A1 | 2/2006 | Lee et al. | |
| 2011/0097487 A1 | 4/2011 | Kerr et al. | |
| 2011/0233049 A1 | 9/2011 | Henninger et al. | |
| 2012/0034135 A1 * | 2/2012 | Risby | H01J 37/32357 422/186.03 |
| 2013/0284369 A1 | 10/2013 | Kobayashi et al. | |
| 2013/0284370 A1 | 10/2013 | Collins et al. | |
| 2014/0055034 A1 | 2/2014 | Coumou | |
| 2014/0148016 A1 | 5/2014 | Kanazawa et al. | |
| 2014/0265910 A1 | 9/2014 | Kobayashi et al. | |
| 2015/0270105 A1 | 9/2015 | Kobayashi et al. | |
| 2015/0270106 A1 | 9/2015 | Kobayashi et al. | |
| 2017/0133202 A1 | 5/2017 | Berry, III | |

FOREIGN PATENT DOCUMENTS

| | | |
|---|---|---|
| CN | 101796213 A | 8/2010 |
| CN | 102549193 A | 7/2012 |
| CN | 102857311 A | 1/2013 |
| CN | 103543349 A | 1/2014 |
| CN | 104471701 | 3/2015 |
| EP | 2541811 | 1/2013 |
| JP | H9-331273 | 12/1997 |
| JP | 2001-110595 | 4/2001 |
| JP | 2014-049667 | 3/2014 |
| JP | 2012-023163 | 2/2016 |
| TW | 480414 B | 3/2002 |
| TW | 200520358 | 6/2005 |
| WO | WO 03/101160 | 12/2003 |
| WO | WO 2006/124734 | 11/2006 |
| WO | WO 2011/125470 | 10/2011 |
| WO | WO 2012/121289 | 9/2012 |

OTHER PUBLICATIONS

Office Action in Taiwan Application No. 105108504, dated Jan. 30, 2019, 5 pages. (with English Search Report).

Office Action in Chinese Application No. 201680023217.1, dated Jan. 8, 2019, 11 pages. (with English translation).

Office Action in Chinese Application No. 201580035762.8, dated Dec. 29, 2018, 11 pages. (with English translation).

Office Action in Japanese Application No. 2017-550111, dated Jul. 2, 2019, 9 pages. (with English translation).

\* cited by examiner

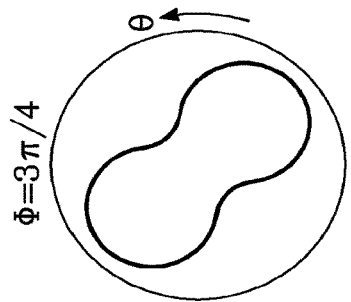
FIG. 5A   FIG. 5B   FIG. 5C   FIG. 5D
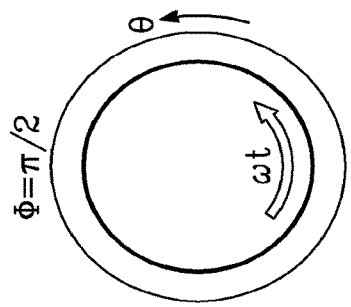
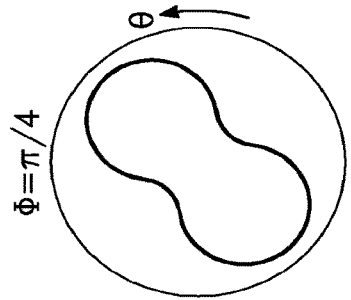
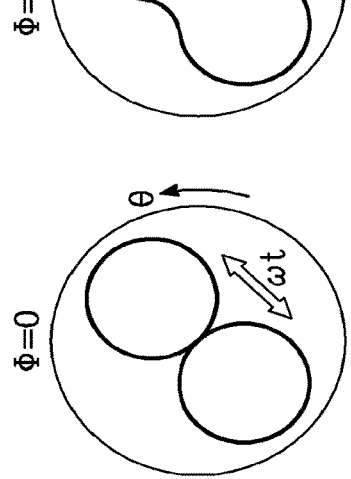
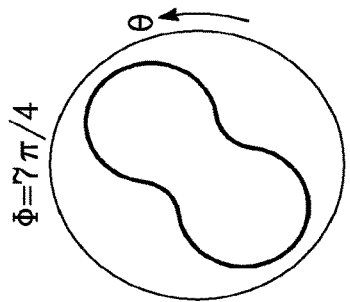
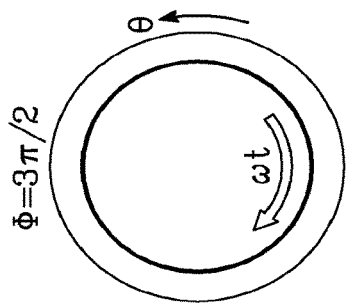
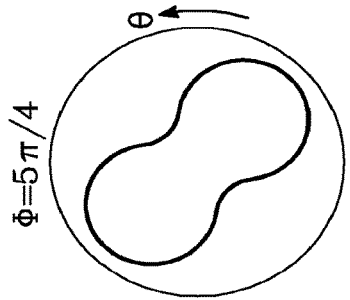
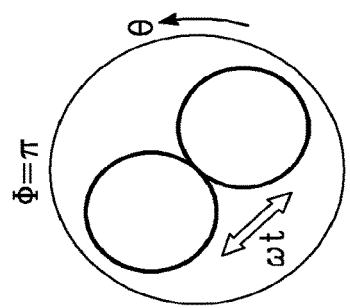
FIG. 5E   FIG. 5F   FIG. 5G   FIG. 5H

PLASMA REACTOR HAVING DIGITAL CONTROL OVER ROTATION FREQUENCY OF A MICROWAVE FIELD WITH DIRECT UP-CONVERSION

CROSS-REFERENCE TO RELATED APPLICATIONS

This application is a continuation of U.S. patent application Ser. No. 14/974,376, filed Dec. 18, 2015, which claims benefit of U.S. Provisional Application Ser. No. 62/136,737, filed Mar. 23, 2015 and U.S. Provisional Application Ser. No. 62/153,688, filed Apr. 28, 2015, the contents of which are incorporated by reference.

BACKGROUND

Technical Field

This application is related to a plasma reactor for processing a workpiece such as a semiconductor wafer, using a microwave plasma source.

Background Discussion

A plasma generated by a microwave plasma source is characterized with a low sheath voltage and high dissociation of reactive gases. In many applications of microwave plasma processing, circular radial waveguides are conventionally used to make uniform plasmas to process circular wafers. However, the resultant plasma often has an inhomogeneous ion density distribution in either or both the radial direction and the azimuthal direction, owing to a non-uniform field distribution of the microwave applicator, and partly owing to excitation of surface waves.

In order to improve the plasma uniformity, it has been proposed to employ a microwave applicator where the highly uniform field of $TE_{111}$ mode rotates in a cylindrical cavity adjacent processing region. This is done by introducing microwaves from two spatially orthogonal directions with a temporal phase difference of 90 degrees. To excite a perfectly circular rotation in the circular cavity, phases and amplitudes of electromagnetic waves in the cylindrical cavity are monitored at two orthogonal positions. The measured phase and amplitude are fed back to a dual output digital microwave generator to assure the perfectly circular rotation. In this system of microwave application, the wave fields are circularly rotated inside the cavity, so that a fairly uniform distribution of plasma is expected particularly in the azimuthal direction.

This approach will work for plasmas at low chamber pressures, e.g., pressures less than 200 mTorr. At high pressures (e.g., pressures over 1 Torr, the plasma is often localized, depending upon where the first ignition occurs. In this situation, even though the rotation of the microwave field may be perfectly circular, the localized plasma cannot follow the rotating field, because the rotation period is extremely short corresponding to the microwave frequency. The rotation period may be on the order of about 0.5 ns (e.g., 1/2.45 GHz), which is much less than a global plasma response time (which can exceed 1 ms). It is desired to provide a way of enhancing uniformity in the plasma without impairment from the inability of plasma under high pressure (e.g., 1 Torr) to follow field rotations at 2.45 GHz.

SUMMARY

A plasma reactor comprises: a cylindrical microwave cavity overlying a workpiece processing chamber, and first and second coupling apertures in a sidewall of the cylindrical microwave cavity spaced apart by an angle; a microwave source having a microwave frequency and comprising a pair of microwave controllers having microwave outputs coupled to respective ones of the first and second coupling apertures. Each of the microwave controllers comprises (a) a source of first and second digital modulation signals having a frequency corresponding to a slow rotation frequency; (b) a source of a first digital carrier signal having an intermediate frequency; (c) a multiplier stage comprising a pair of multipliers each having a pair of inputs, the multiplier stage coupled to receive, respectively, (a) the first digital modulation signal, the second digital modulation signal and the first digital carrier signal, respectively, the multiplier stage having respective outputs, in1 and in2; and (d) a digital-to-analog converter coupled to receive the respective outputs in1 and in2 and having analog outputs corresponding to the outputs in1 and in2; and an up-converter having inputs coupled to the analog outputs, the up-converter comprising the microwave outputs.

In one embodiment, a first one of the pair of multipliers is coupled to receive the first digital modulation signal and the digital carrier signal, and having a first multiplier output comprising the output in1, while a second one of the pair of multipliers is coupled to receive the second digital modulation signal and the digital carrier signal, and having a second multiplier output comprising the output in2.

In another embodiment, the reactor further comprises a source of a second digital carrier signal of the intermediate frequency, wherein: the source of the first digital carrier signal is coupled to the output in1; a first one of the pair of multipliers is coupled to receive the first digital modulation signal and the first digital carrier signal; a second one of the pair of multipliers is coupled to receive the second digital modulation signal and the second digital carrier signal, and having a second multiplier output comprising the multiplier output in2; wherein the multiplier stage further comprises an adder coupled to receive outputs of the first and second multipliers, the adder having an output comprising the output in2.

In one embodiment, the first and second amplitude modulation signals comprise, respectively, a cosine-form component I and a sine-form component Q.

In one embodiment, the source of first and second amplitude modulation signals comprises a first RAM (random access memory) containing successive samples of the cosine-form component I, a second RAM containing successive samples of the sine-form component Q, and a low clock pointer directed at the successive samples of I and Q in synchronism with the slow rotation frequency.

In one embodiment, the source of a digital carrier signal comprises a third RAM containing successive samples of the digital carrier signal, and a low clock pointer directed at the successive samples of the digital carrier signal in synchronism with the intermediate frequency.

In one embodiment, the up-converter has an output frequency equal to the microwave frequency.

In one embodiment, each of the multipliers produces a product of the signals at its input.

In one embodiment, the plasma reactor further comprises a user interface for allowing a user to specify the slow rotation frequency. In one embodiment, the user interface further allows a user to specify a phase difference between the microwave signal outputs.

In accordance with one embodiment, a method is provided for producing a rotating microwave field in a cavity having a pair of microwave injection ports offset by an angle, having a controlled slow rotation frequency. The method comprises: producing first and second digital carriers of an intermediate frequency below the frequency of the microwave field, the first and second digital carriers being co-functions of one another; producing at least one of first and second digital modulation signals of a slow frequency corresponding to the slow rotation frequency, the first and second digital modulation signals being corresponding cosine-form and sine-form components; producing first and second digital carriers of an intermediate frequency below the frequency of the microwave field, the first and second digital carriers being co-functions of one another; mixing at least the second digital modulation signal with at least one of the first and second digital carriers to produce at least one of a pair of digital outputs in1 and in2; and up-converting the digital outputs to the microwave frequency to produce a pair of offset microwave signals, and applying the pair of offset microwave signals to the pair of microwave injection ports.

In one embodiment, the method further comprises mixing the first and second digital modulation signals with respective ones of the first and second digital carriers to produce respective ones of the pair of digital outputs in1 and in2.

In one embodiment, the method further comprises: providing the first digital carrier signal as the output in1; mixing the first and second digital carriers with respective ones of the first and second digital modulation signals, and adding the corresponding products to produce the output in2.

In accordance with a further aspect employing direct up-conversion, a plasma reactor comprises a cylindrical microwave cavity overlying a workpiece processing chamber, and first and second coupling apertures in a sidewall of the cylindrical microwave cavity spaced apart by an angle; a microwave source having a microwave frequency and comprising microwave outputs coupled to respective ones of the first and second coupling apertures. The microwave source comprises a source of an in-phase component 1-A and of a quadrature component 2-A of a digital modulation signal having a frequency corresponding to a slow rotation frequency; a digital-to-analog converter coupled to receive the in-phase and quadrature components 1-A and 1-B, and having corresponding analog outputs in1 and in2; and an up-converter comprising: (a) a first combiner function comprising respective inputs of the analog output in1 and an in-phase component of the microwave frequency, and a first product output corresponding to a first one of the microwave outputs; and (b) a second combiner function comprising respective inputs of the analog output in2 and an in-phase component of the microwave frequency, the second combiner function comprising a second product output.

In one embodiment, the second product output is coupled to a second one of the microwave outputs.

In a different embodiment, the microwave source further comprises a source of a constant signal A, and wherein the up-converter further comprises: a third combiner function having one input coupled to receive the constant signal A and another input coupled to receive the quadrature component of the microwave frequency, and a third product output; and an adder function having inputs coupled to the second and third product outputs respectively and a sum output coupled to the second one of the microwave outputs.

In one embodiment, the source of an in-phase component of the digital modulation signal produces a sum of the digital modulation signal and the constant signal A.

In one embodiment, the in-phase and quadrature components comprise, respectively, a cosine-form component I and a sine-form component Q. In one embodiment, the source of the in-phase component of the digital modulation signal comprises a first RAM containing successive samples of the cosine-form component I; the source of the quadrature component of the digital modulation signal comprises a second RAM containing successive samples of the sine-form component Q; and a low clock pointer is directed at the successive samples of I and Q in synchronism with the slow rotation frequency.

In one embodiment, the up-converter has an output frequency equal to the microwave frequency.

In one embodiment, each combiner function is adapted to produce a product of the signals at its inputs.

In one embodiment, the angle is 90 degrees.

In one embodiment, the plasma reactor further comprises a user interface for allowing a user to specify the slow rotation frequency. In one embodiment, the user interface further allows a user to specify a phase difference between the respective microwave outputs.

In accordance with a further aspect, in a plasma reactor a cylindrical microwave cavity overlies a workpiece processing chamber, and first and second coupling apertures in a wall of the cylindrical microwave cavity are spaced apart by an angle. A microwave source has a microwave frequency and comprises respective microwave outputs coupled to respective ones of the first and second coupling apertures, the microwave source further comprising a source of an in-phase component 2-A and of a quadrature component 2-B of a digital modulation signal having a frequency corresponding to a slow rotation frequency; a digital-to-analog converter coupled to receive the in-phase and quadrature components 2-A and 2-B, and having corresponding analog outputs 2-Iin and 2-Qin; and an up-converter comprising: (a) a first combiner output corresponding to a product of a constant signal A and an in-phase component of the microwave frequency, and coupled to a first one of the microwave outputs; (b) a second combiner output corresponding to a product of the analog output 2-Iin and an in-phase component of the microwave frequency; (c) a third combiner output corresponding to a product of the analog output 2-Qin and a quadrature component of the microwave frequency, and an adder having inputs comprising the second and a third combiner outputs and a sum output coupled to a second one of the microwave outputs.

In one embodiment, the in-phase and quadrature components comprise, respectively, a cosine-form component I and a sine-form component Q. In one embodiment, the source of the in-phase component of the digital modulation signal comprises a first RAM containing successive samples of the cosine-form component I; the source of the quadrature component of the digital modulation signal comprises a second RAM containing successive samples of the sine-form component Q; and a low clock pointer is directed at the successive samples of I and Q in synchronism with the slow rotation frequency.

A method of producing a rotating microwave field of a microwave frequency in a cavity having a pair of microwave injection ports offset by an angle, comprises: producing at least one of in-phase and quadrature components of a modulation signal of a frequency corresponding to a slow rotation frequency; producing combinations of the in-phase component and quadrature component of the modulation signal with at least one of an in-phase component or quadrature component of the microwave frequency and producing from the combinations a pair of output signals, and applying the pair of output signals to the pair of microwave injection ports.

In one embodiment, the producing combinations comprises producing: a first product of the in-phase component of the modulation signal and the in-phase component of the microwave frequency, and a second product of the quadrature component of the modulation signal and the quadrature component of the microwave frequency.

In one embodiment, the method further comprises one of: (a) adding the first and second products to produce one of pair of output signals, or (b) providing the first and second products as the pair of output signals.

In one embodiment, the foregoing method is carried out by a computer programmed to perform the method.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIGS. 5A through 5H depict microwave field behavior for different values of a user-selected phase angle ϕ between the two microwave signals coupled to the circular cavity.

Figure 1A:
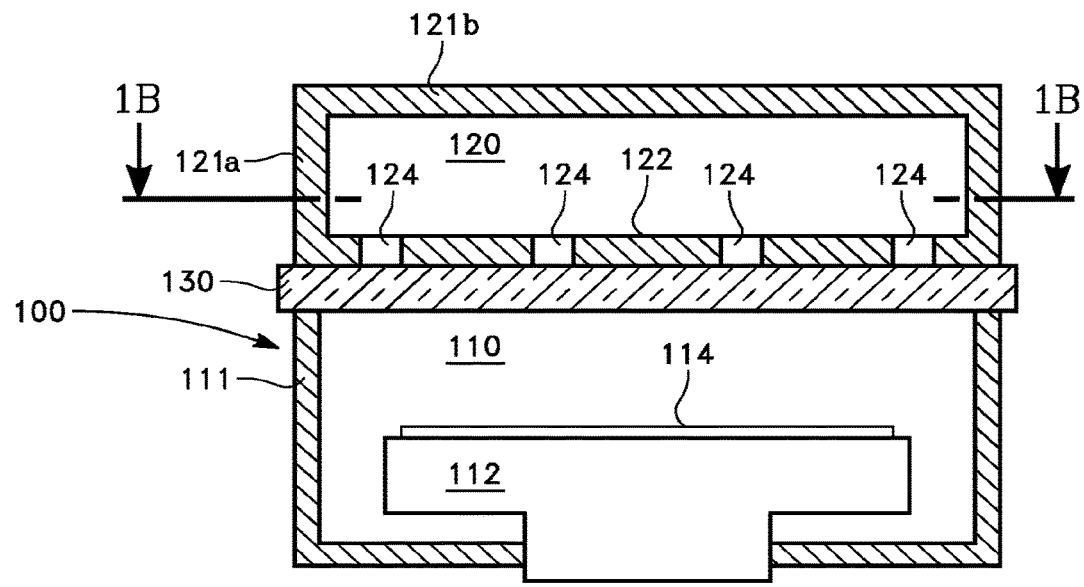
FIG. 1A is an elevational view of a reactor employed in one embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

In order to resolve the issue of plasma uniformity at high chamber pressures at which the plasma is unable to follow fast rotations of the microwave field, embodiments described below provide new modes of microwave cavity excitation. A first mode is a slow rotation mode excited by amplitude modulation. A second mode is a slow pulsing mode excited by phase modulation. In these modes, the modulation frequency can be arbitrarily low, typically 0.1-1000 Hz, which corresponds to the rotation period of 1 ms-10 s. At such low rotation frequencies, a localized plasma under high chamber pressure can follow the rotation, thus enabling a uniform distribution of plasma ion density.

Figure 1B:
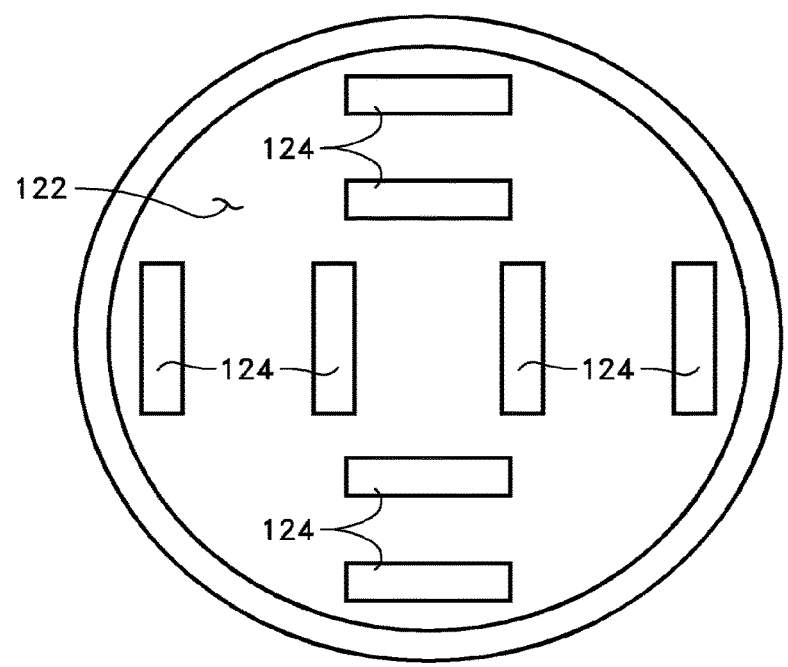
FIG. 1B is a plan view corresponding to FIG. 1A.
Figure 1C:
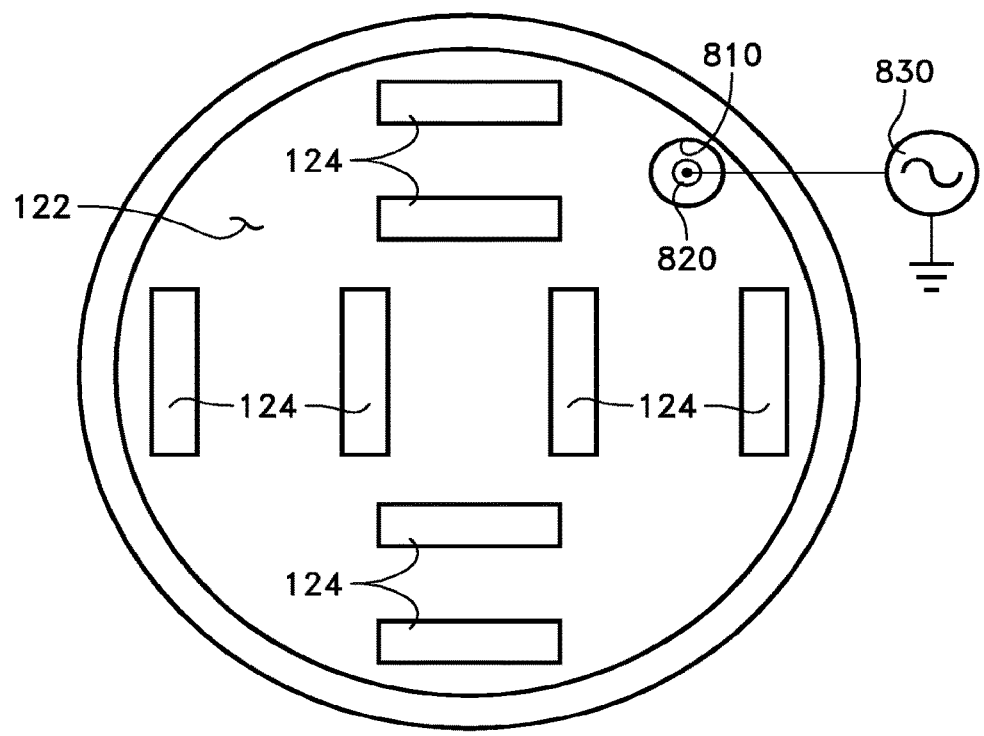
FIG. 1C depicts a modification of the embodiment of FIG. 1B including an ignition electrode.

FIG. 1A is a simplified side view of a plasma reactor 100 including a processing chamber 110 enclosed by a wall 111 and containing gas under vacuum pressure and a workpiece support 112 for supporting a workpiece 114. A cylindrical cavity 120 overlying the processing chamber 110 is enclosed by a side wall 121a, a ceiling 121b and a floor 122 having slots 124 shown in FIG. 1B. The walls 121a and 111 can be connected by metal structures, depending upon application. A dielectric plate 130 provides a vacuum seal under the floor 122. The dielectric plate 130 is preferably formed of a material that is transparent to microwave radiation. FIG. 1C depicts an embodiment in which the floor 122 has an opening 810 and an auxiliary ignition electrode 820 is disposed in the opening 810 with a vacuum seal (not shown). The auxiliary ignition electrode 820 is driven by an RF source 830 of an RF frequency in a range of 100 Hz-10 MHz. The RF source 830 may include an impedance match (not illustrated). The floor 122 and/or the wall 111 of the processing chamber 110 can function as a ground plane with respect to the auxiliary ignition electrode 820. Alternatively, an auxiliary ignition electrode can be located on the wall 111 by providing an additional opening and vacuum seal. The electrode 820 and the ground plane are separated only by the opening 810. In summary, the auxiliary ignition electrode 820 together with the ground plane (i.e., the floor 122 and/or the wall 111 of the cavity 110) form a capacitively coupled RF igniting circuit to help ignition of plasma that is ultimately sustained by microwave power.

Figure 2:
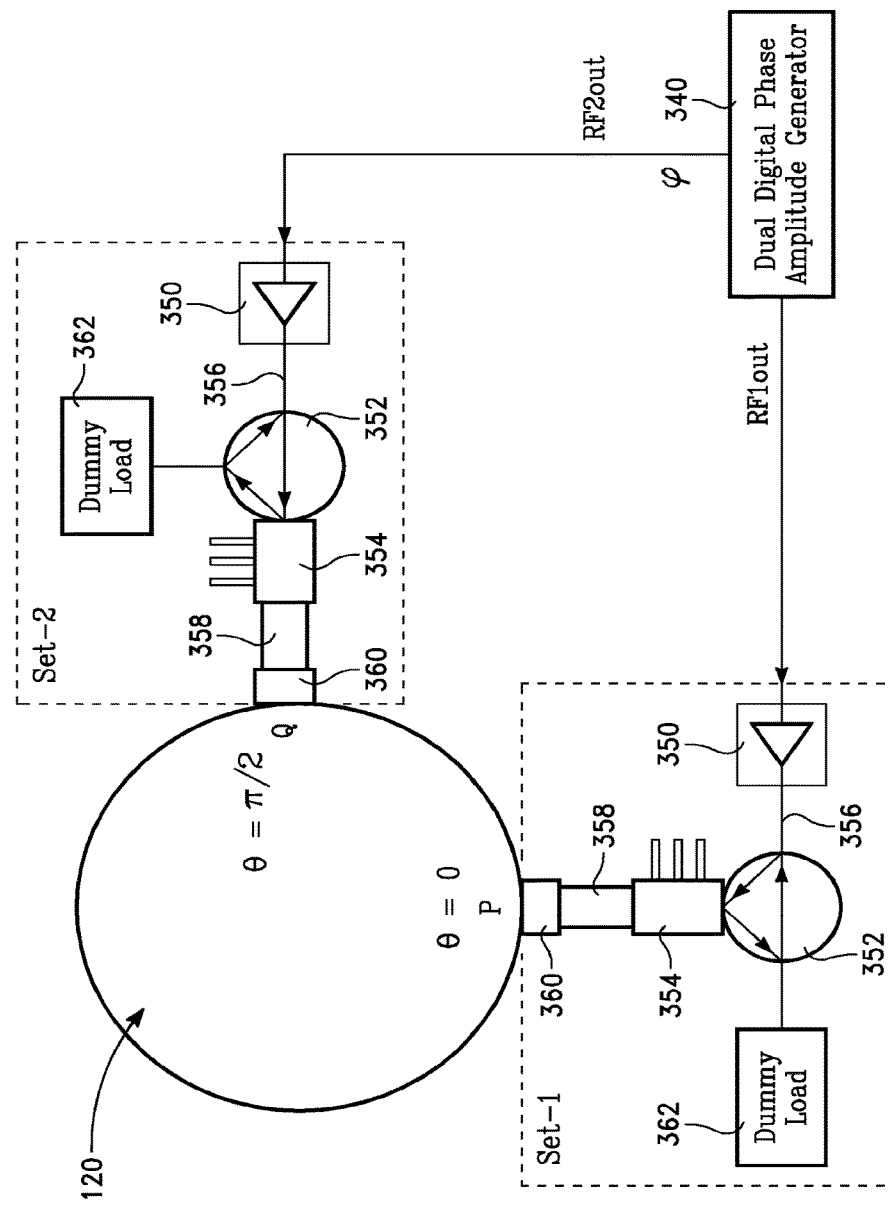
FIG. 2 is a block diagram of a system in one embodiment.

FIG. 2 shows a system of dual microwave injection into the cylindrical cavity 120. Two identical microwave modules Set-1 and Set-2 are connected to the cylindrical cavity 120 at spatially orthogonal positions, P and Q. The opposite ends of the modules Set-1 and Set-2 are connected to a dual digital phase and amplitude generator 340. The dual digital phase and amplitude generator 340 supplies microwave seed signals RF1out and RF2out to the modules Set 1 and Set 2, respectively. In each module Set-1 and Set-2, the seed signal is amplified by an amplifier 350, and is transmitted to a circulator 352 and a tuner 354, typically 3-stub tuner, for impedance matching. Coaxial transmission lines 356 conduct microwave power from the output of the amplifier 350 to the tuner 354. In this example, a coaxial-to-waveguide transformer 358 is inserted between the tuner 354 and a coupling aperture 360 of the cylindrical cavity 120. However, if a pole or loop antenna is adopted instead of the coupling aperture, the transformer 358 is not needed. A dummy load 362 is connected to one port of the circulator 352 where reflected power may be dumped to protect the amplifier 350. The microwaves are introduced into the cylindrical cavity 120 through the coupling aperture 360 of each module Set-1 and Set-2, and excite the $TE_{111}$ mode in the cylindrical cavity 120. In FIG. 2, θ denotes an azimuthal coordinate, where θ=0 is at point P, and θ=π/2 is at Q. φ denotes a temporal phase angle difference of the microwave seed signal RF2out referenced to the microwave seed signal RF1out.

Slow Rotation Mode by Amplitude Modulation:

The $TE_{111}$ mode can be provided by proper selection of the radius and height of the cylindrical cavity 120 at a given angular frequency ω of the dual digital phase and amplitude generator 340. When microwaves are injected through the coupling aperture at P in this condition, clockwise and anti-clockwise rotating waves are simultaneously launched with equal probabilities. The axial magnetic field component $H_z$ of $TE_{111}$ mode at a position $(r,\theta,z)$ can be written using Bessel function $J_1$ of the first kind as $$H_z = A[\cos(\theta-\omega t)+\cos(\theta+\omega t)]J_1(\kappa r)\cos(\beta z), \quad (1)$$

where A is the amplitude, $\beta$ is the axial wave number determined by the cavity height, and $\kappa$ is the radial wavenumber defined by $$\kappa^2 = \left(\frac{\omega}{c}\right)^2 - \beta^2.$$

Considering the fixed positions of r and z, equation (1) can be rewritten in a normalized form as $$\eta_P = a[\cos(\theta-\omega t)+\cos(\theta+\omega t)] = 2a\cos\theta\cos\omega t. \quad (2)$$

In the same manner, the wave launched from the coupling aperture at position Q can be written with a phase delay $\varphi$ as:

$$\eta_Q = b[\sin(\theta-\omega t+\varphi-\pi/2)+\cos(\theta+\omega t-\varphi-\pi/2)] = 2b\sin\theta\cos(\omega t-\varphi). \quad (3)$$

In the case of in-phase injection ($\varphi=0$) of the carrier frequency $\omega$, the simultaneous dual injection from P and Q yields the resultant field:

$$\eta = \eta_P + \eta_Q = 2(a\cos\theta + b\sin\theta)\cos\omega t. \quad (4)$$

For slow rotation, the amplitudes a and b are modulated at a low angular frequency $\Omega_a$ ($\ll\omega$) as $$a = c\cos\Omega_a t \quad (5)$$

$$b = c\cos(\Omega_a t - \gamma) \quad (6)$$

where $\gamma$ is the phase difference in the modulation. Then eq. (4) is reduced to:

$$\eta = A\cos(\Omega_a t + \psi)\cos\omega t \quad (7)$$

where the amplitude A and the phase $\psi$ are given by $$A = 2c\sqrt{1 + \sin 2\theta \cos\gamma} \quad (8)$$

$$\tan\psi = -\frac{\sin\theta\sin\gamma}{\cos\theta + \sin\theta\cos\gamma} \quad (9)$$

In a special case of $$\gamma = \frac{\pi}{2}$$

(positive quadrature), a simpler relation applies:

$$\eta = 2c\cos(\theta - \Omega_a t)\cos\omega t \quad (10)$$

In the case of $$\gamma = -\frac{\pi}{2}$$

(negative quadrature), equations (7), (8) and (9) reduce to a similar relation:

$$\eta = 2c\cos(\theta + \Omega_a t)\cos\omega t. \quad (11)$$

Equations (10) and (11) respectively express the clockwise and anti-clockwise rotation of field at the low modulation frequency $\Omega_a$.

The foregoing description is provided in terms of the axial magnetic component $H_z$. However, all other components of the magnetic field as well as the electric field rotate together with $H_z$.

To excite the clock-wise rotating wave represented by equation 10 (or equation 11), waves launched from P and Q should have forms proportional to equation 5 and equation 6 with the carrier angular frequency $\omega$, and $$\gamma = \frac{\pi}{2}$$

(or $$-\frac{\pi}{2}$$

), respectively:

$$\zeta_P = \alpha\cos\Omega_a t\cos\omega t \quad (12)$$

and $$\zeta_Q = \pm\alpha\sin\Omega_a t\cos\omega t \quad (13)$$

The wave field inside the cylindrical cavity 120 rotates with the angular frequency $\Omega_a$, the direction (clockwise or anti-clockwise) depending upon the sign in equation (13). Introducing initial phases $\varphi_l$ for $\Omega$ and $\varphi_h$ for $\omega$, equations (12) and (13) can be expressed in a more general form as $$\zeta_P = \alpha\cos(\Omega_a t+\varphi_l)\cos(\omega t+\varphi_h)$$

and $$\zeta_Q = \pm\alpha\sin(\Omega_a t+\varphi_l)\cos(\omega t+\varphi_h)$$

where $\varphi_l$ and $\varphi_h$ are arbitrary initial phases. Without losing generality, $\varphi_l$ is set at 0 in the remainder of this description, providing the following simplification:

$$\zeta_P = \alpha\cos\Omega_a t\cos(\omega t+\varphi_h) \quad (14)$$

$$\zeta_Q = \pm\alpha\sin\Omega_a t\cos(\omega t+\varphi_h). \quad (15)$$

Conventional analog amplitude modulators can generate the input signals represented by equations (14) and (15). However, in such analog modulators, it is difficult to change the rotation frequency $f_{\Omega_a} = \Omega_a/2\pi$. Embodiments herein employ a digital controller, such as a field programmable gate array (FPGA) using different random access memories (RAMs) to generate the desired waveforms, in order to this issue. However, to implement equations (14) and (15) in a digital controller, time scale differences between $\sin\Omega_a t$ and $\cos(\omega t+\varphi_h)$ should be considered carefully. Otherwise, an undesirably large amount of RAM may be required to implement the terms of $\cos\Omega_a t$ and $\sin\Omega_a t$.

Figure 3:
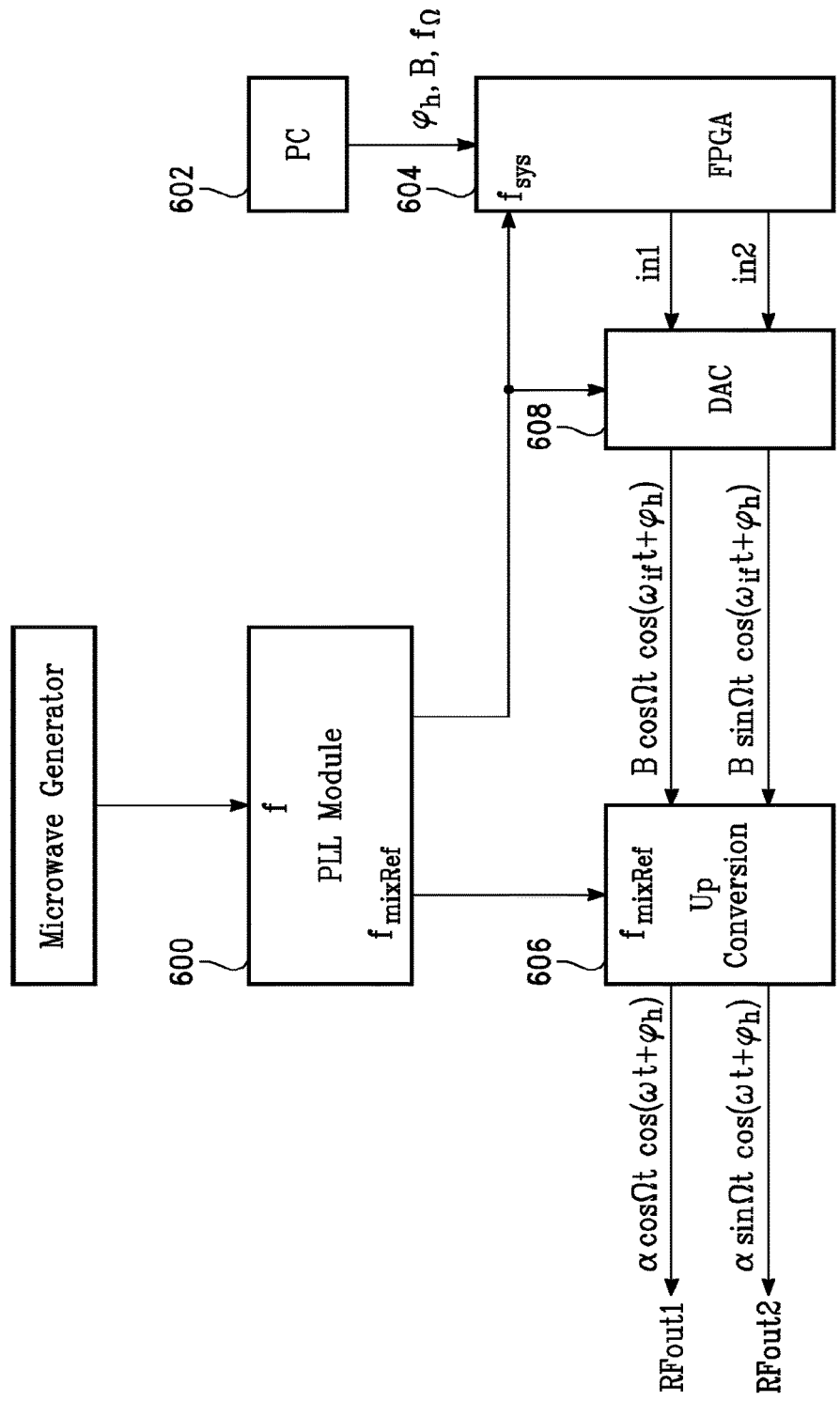
FIG. 3 is a block diagram of a signal processing component in the system of FIG. 2.

The dual digital phase and amplitude generator 340 generates the microwave signals RF1out and RF2out furnished to the modules Set1 and Set2. The internal structure of the amplitude generator 340 is depicted by the block diagram of FIG. 3, in accordance with one embodiment. The following description of FIG. 3 refers to equations (14) and (15), but only the version of equation (15) corresponding to the plus sign is considered, for simplicity. A system-controlling clock, $f_{sys}$, and an up-conversion frequency $f_{mixRef}$ are generated in a PLL (phase locked loop) module 600. User-chosen values of $\varphi_h$, B, $f_\Omega$ related to equations (14) and (15) are entered via a user interface, which may be implemented as a computer or PC 602, where B is proportional to a. Those data are transferred to a FPGA (field programmable gate array) 604 driven by $f_{sys}$. The FPGA 604 generates two digital signals, in1 and in2 of an intermediate frequency, in a manner discussed below. The digital signals in1 and in2 are transmitted separately to a DAC (digital to analog converter) 608. The DAC 608 converts the digital signals in1 and in2 to analog IF (intermediate frequency) signals defined by B cos $\Omega_a$t cos($\omega_{if}$t+$\varphi_h$) and B sin $\Omega_a$t cos($\omega_{if}$t+$\varphi_h$), respectively. The intermediate angular frequency is $\omega_{if}$=2π$f_{if}$. The two analog IF signals B cos $\Omega_a$t cos($\omega_{if}$t+$\varphi_h$) and B sin $\Omega_a$t cos($\omega_{if}$t+$\varphi_h$) are up-converted to the microwave angular frequency ω=2πf by an up-converter 612, using the up-conversion frequency $f_{mixRef}$, to produce the output signals of equations (14) and (15). These output signals are labelled in FIG. 3 as RFout1 and RFout2, and are coupled through the respective modules Set-1 and Set-2 to the respective coupling apertures 360 at positions P and Q of the cylindrical cavity 120 of FIG. 2.

Figure 4:
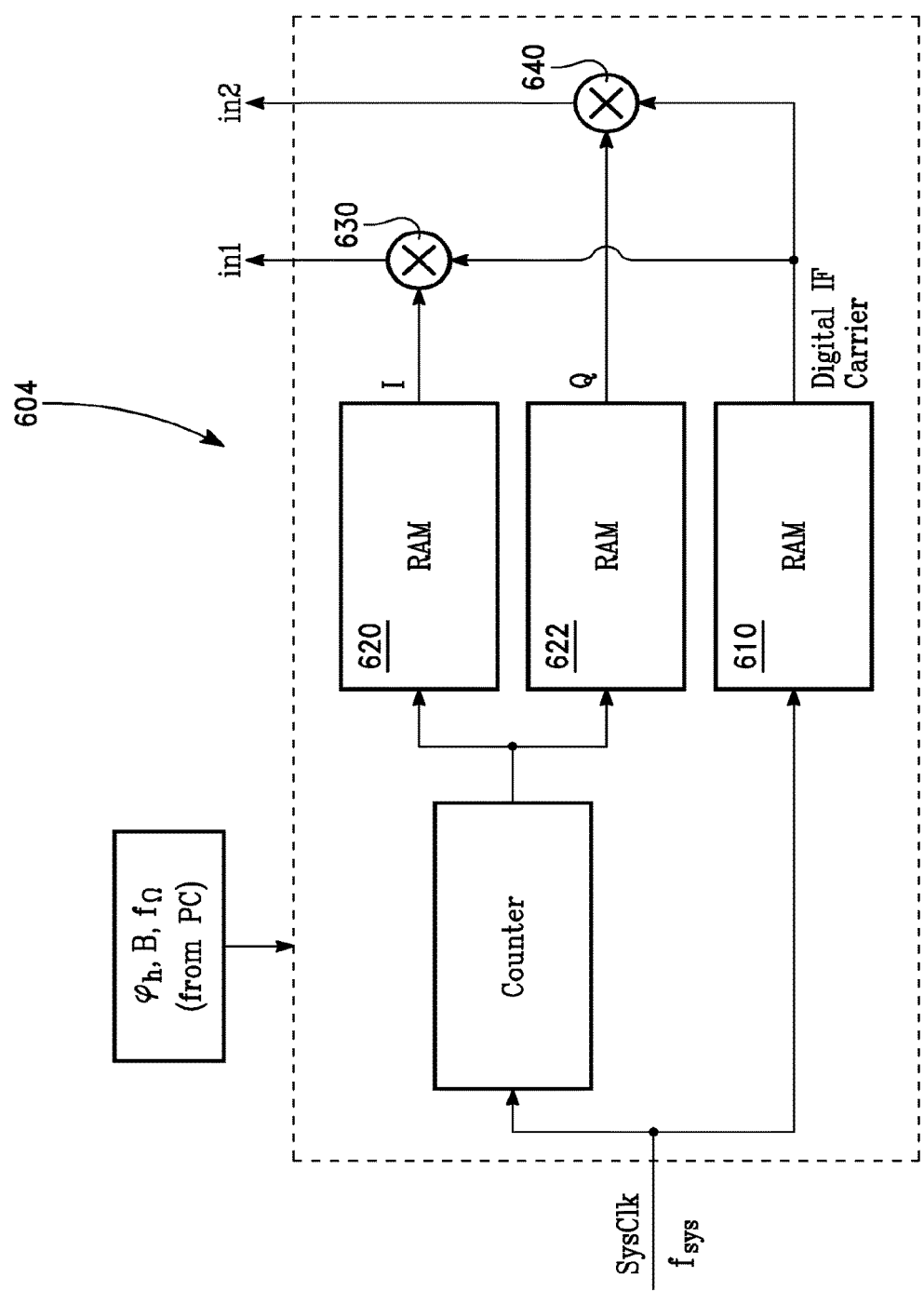
FIG. 4 is a block diagram of a portion of the system of FIG. 3.

FIG. 4 is a block diagram of one embodiment of the FPGA 604. A RAM 610 uses the system controlling clock, $f_{sys}$, to generate a first digital IF carrier $$\cos\left(2\pi \frac{1}{N_{sys}} n_{sys} + \varphi_h\right),$$

where $N_{sys}=2^n$ is the carrier wave modulus and $n_{sys}$ is the count of the carrier wave. The value of n is chosen by the user, and typically n may be in a range of 5 to 7.

The amplitude modulation waves necessary for slow rotation of the microwave field are generated by RAMs 620 and 622 using a low clock of a frequency $f_{lclk}$ ($=N_{lclk} f_\Omega$) corresponding to the desired low frequency of rotation. In one embodiment, $f_{lclk}=N_{lclk} f_\Omega$. Typically, $N_{lclk}=2^m$. The integer m is arbitrary. One typical choice is $N_{sys}=2^n N_{lclk}$.

The RAM 620 produces a cosine-form (in-phase) component, I, with the slow wave count $n_{lclk}$ and the slow wave modulus $N_{lclk}$ as $$I = B\cos\left(2\pi \frac{1}{N_{lclk}} n_{lclk} + \varphi_h\right).$$

The low clock count $n_{lclk}$ functions as an address pointer to successive locations in the RAM 620 storing successive samples of I.

The RAM 622 produces a sine-form (quadrature) component, Q, in accordance with the low clock count $n_{lclk}$ and the low clock modulus $N_{lclk}$ as $$Q = B\sin\left(2\pi \frac{1}{N_{lclk}} n_{lclk} + \varphi_h\right).$$

The low clock count $n_{lclk}$ functions as an address pointer to successive locations in the RAM 622 storing successive samples of Q.

A digital multiplier 630 combines the cosine-form component, I, with the digital IF carrier from the RAM 610 to produce the digital signal in1. A digital multiplier 640 combines the sine-form component, Q, with the digital IF carrier from the RAM 610 to produce the digital signal in2.

As described above with reference to FIG. 3, the DAC 608 converts the digital signals in1 and in2 to analog IF (intermediate frequency) signals defined by B cos $\Omega_a$t cos($\omega_{if}$t+$\varphi_h$) and B sin $\Omega_a$t cos($\omega_{if}$t+$\varphi_h$), respectively. As described above with reference to FIG. 3, the analog IF signal is up-converted by the up-converter 606 to the corresponding microwave signals RF1out and RF2out. The microwave signals RF1out and RF2out are coupled to the cylindrical cavity 120 of FIG. 2.

Slow Rotation and Oscillation Mode by Phase Modulation:

Considering the case of constant amplitude a=b in equations (2) and (3), the resultant field becomes:

$$\eta = \eta_P + \eta_Q = 2a[\cos\theta \cos\omega t + \sin\theta \cos(\omega t - \varphi)]. \tag{16}$$

In a special case of $\varphi = \mp$ $$\varphi = \mp \frac{\pi}{2},$$

equation (16) reduces to $$\eta = 2a \cos(\theta \mp \omega t). \tag{17}$$

Equation (17) signifies the circular clockwise/anti-clockwise rotation at the microwave frequency ω. In this case, the injected microwaves at P and Q are respectively expressed by considering a coupling effect as in equations (12) and (13), $$\zeta_P = \alpha \cos(\omega t + \varphi_h) \tag{17-2}$$

and $$\zeta_Q = \pm\alpha \sin(\omega t + \varphi_h). \tag{17-3}$$

In case of arbitrary phase $\varphi$, equation (16) can be simplified as $$\eta = C \cos(\omega t + \psi) \tag{18}$$

where $$C = 2a\sqrt{1 + \sin 2\theta \cos\varphi} \tag{19}$$

and $$\tan\psi = -\frac{\sin\theta \sin\varphi}{\cos\theta + \sin\theta\cos\varphi}. \tag{20}$$

A linear phase modulation may be introduced into equations (18)-(20) by introducing the following:

$$\varphi = \Omega_p t \text{(where } \Omega_p \ll \omega\text{)}. \tag{21}$$

In such a case, $\varphi$ is ramped over time, and the amplitude C expressed in eq. (19) shows different distributions of the microwave field in polar coordinates for successive values of $\varphi$ as depicted in FIGS. 5A through 5H. From FIGS. 5A through 5H, it is seen that the resulting microwave field distribution successively alternates between rotation and oscillation, as $\varphi$ is ramped over time.

Oscillation and slow rotation at a rotation frequency of $\Omega_p$ is obtained by driving the microwave inputs at locations P and Q of FIG. 2 by the following signals:

$$\zeta_P = \alpha \cos(\omega t + \varphi_h) \quad (22)$$

and $$\zeta_Q = \alpha \cos(\omega t + \varphi_h - \Omega_p t) = \alpha[\cos(\omega t + \varphi_h)\cos \Omega_p t + \sin(\omega t + \varphi_h)\sin \Omega_p t] \quad (23)$$

In this case, the wave in the cavity alternates oscillation and rotation with frequency $\Omega_p$, resulting in a pulsing mode.

Figure 6:
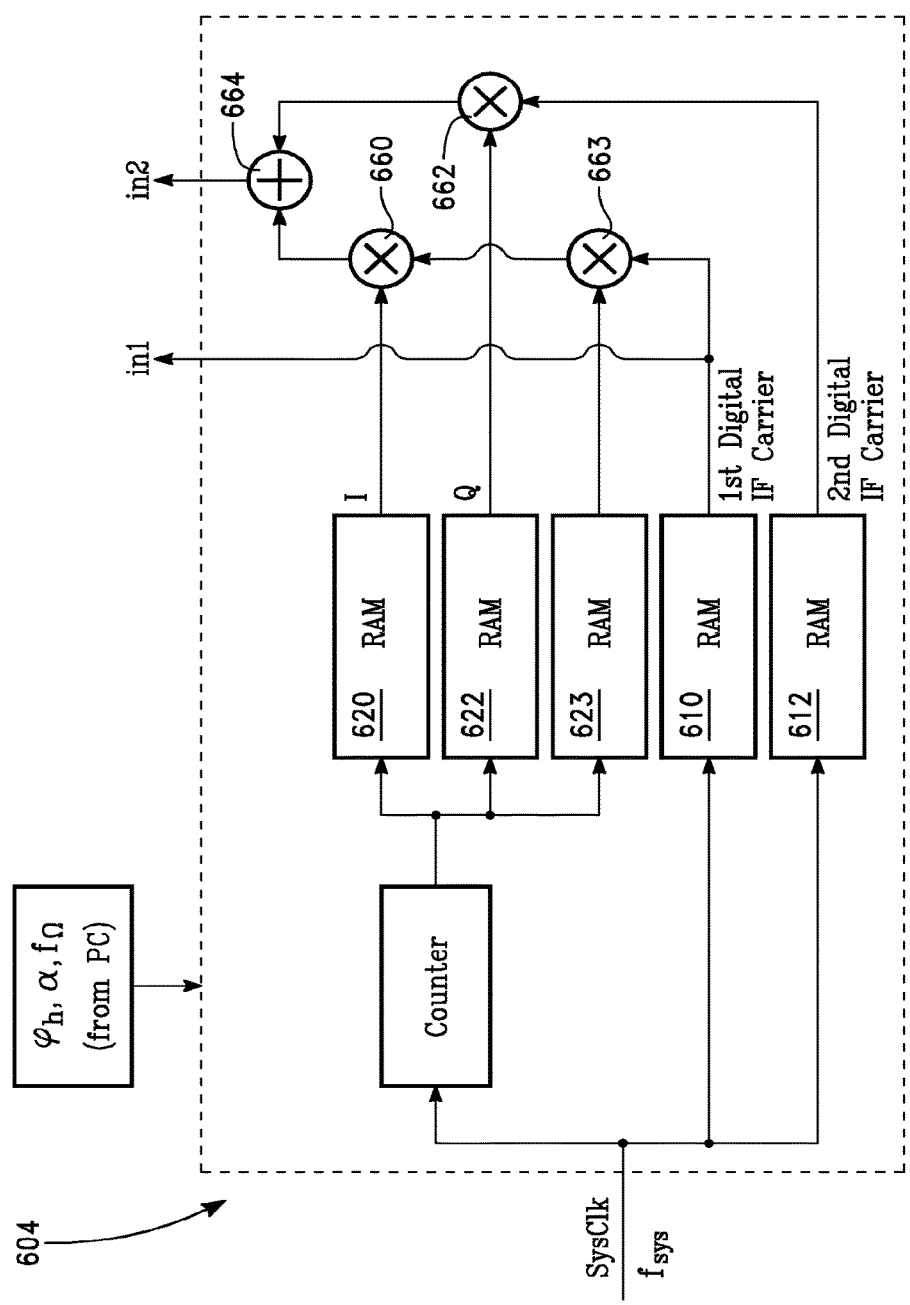
FIG. 6 is a block diagram of a portion of the system of FIG. 3 in accordance with a second embodiment.

Conventional analog phase modulation implements equation (22). However, the choice of $\Omega_p$ is limited. In the digital implementation of equations (22) and (23), the time scale difference between $\omega$ and $\Omega_p$ should be taken into consideration. In order to generate the signals of equations (22) and (23), the FPGA 604 of FIG. 3 has the internal structure depicted in FIG. 6, which is a modification of the structure of FIG. 4. In FIG. 6, the RAMs 610, 620 and 622 function in the manner described above with reference to FIG. 4. The RAM 623 of FIG. 6 provides the constant a. An additional RAM 612 in the embodiment of FIG. 6 uses the system controlling clock, $f_{sys}$, to generate a second digital IF carrier:

$$\sin\left(2\pi \frac{1}{N_{sys}} n_{sys} + \varphi_h\right),$$

where $N_{sys} = 2^n$ is the carrier wave modulus and $n_{sys}$ is the count of the carrier wave.

The RAMs 620 and 622 store signals generating the linear modulation represented by equation 23 of cos $\Omega_p t$ and sin $\Omega_p t$, where $\Omega_p$ is the desired slow rotation/oscillation frequency. The respective modulation signals are co-functions of one another because they contain corresponding sin and cosine terms.

The output of the RAM 610 is used as the digital signal in1. A digital multiplier 660 multiplies the outputs of the RAMs 610 and 620 together. A digital multiplier 662 multiplies the outputs of the RAMs 612 and 622 together. An adder 664 adds the products of the digital multipliers 660, 662 and 663 together and provides the resulting sum as the digital signal in2. The digital signals in1 and in2 thus generated are converted by the digital-to-analog converter 608 to corresponding analog signals which are processed in the manner described above with reference to FIG. 4 to produce the microwave signals RFout1 and RFout2.

Superposition of the Three Modes:

In the foregoing, three modes have been described: (a) fast rotation mode with angular frequency $\omega$ as the carrier frequency (equations (17-2) and (17-3)); (b) slow rotation mode with angular frequency $\Omega$ ($\Omega \ll \omega$) (equations (14) and (15)); and (c) slow pulsing mode with angular frequency $\Omega_p$ with $\Omega_p \ll \omega$ (equations (22) and (23)). In the amplitude modulation of equations (14) and (15), for example, one may modify the amplitude as $(1+\mu \sin \Omega_a t)$ for the constant $\mu$, and add the phase modulation term $-\Omega_p t$, yielding the following set of equations:

$$\zeta_P = \alpha \cos \Omega_a t \cos(\omega t + \varphi_h) \quad (24-1)$$

$$\zeta_Q = \pm\alpha(1+\mu \sin \Omega_a t)\cos(\omega t + \varphi_h - \Omega_p t) \quad (24-2)$$

Figure 7:
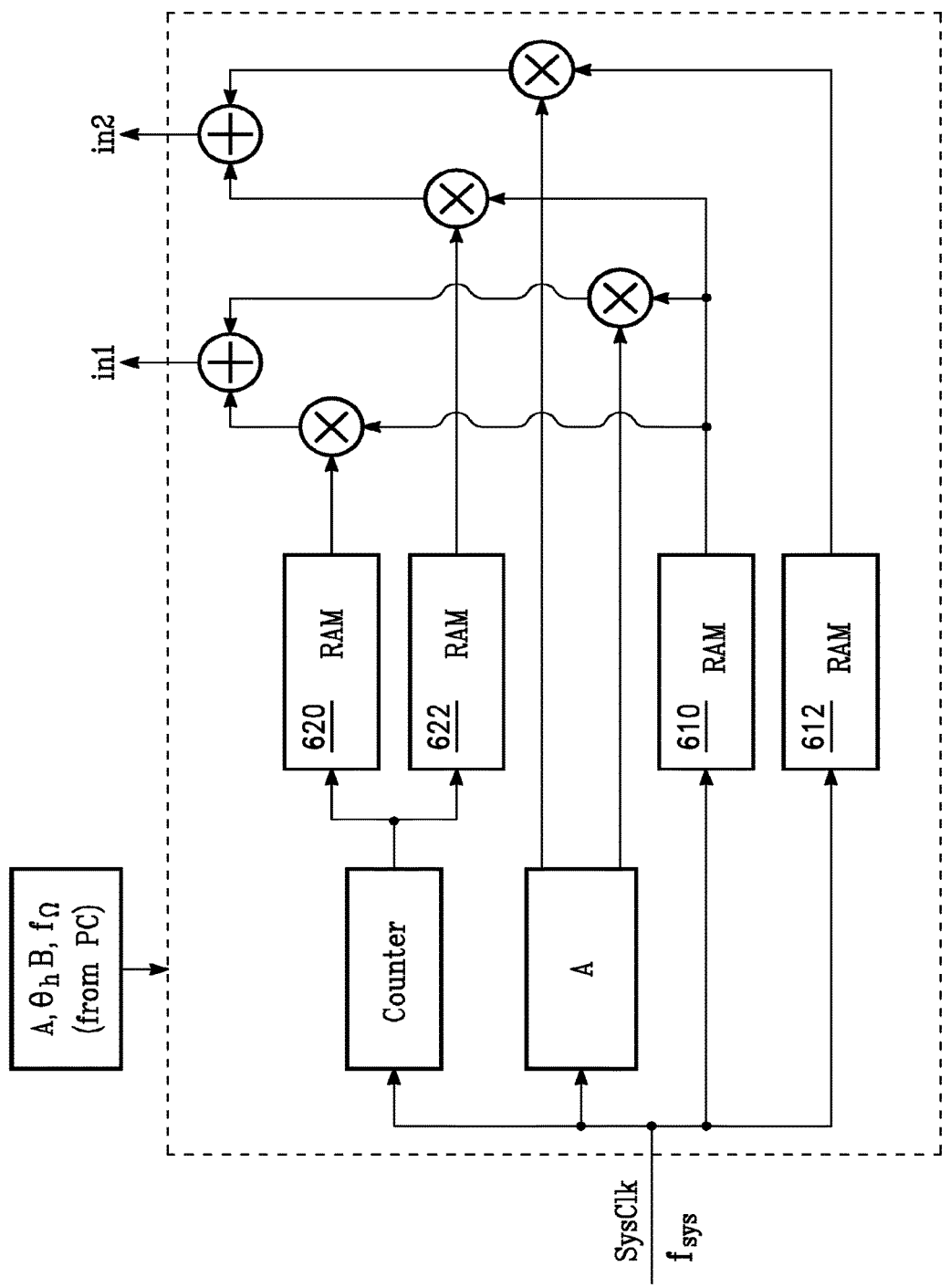
FIG. 7 is a block diagram of a portion of the system of FIG. 3 in accordance with a third embodiment.

This type of dual injection includes the three rotation modes referred to above. When combining modes (a) and (b), the FPGA of FIG. 6 is modified to the structure shown in FIG. 7.

Figure 8:
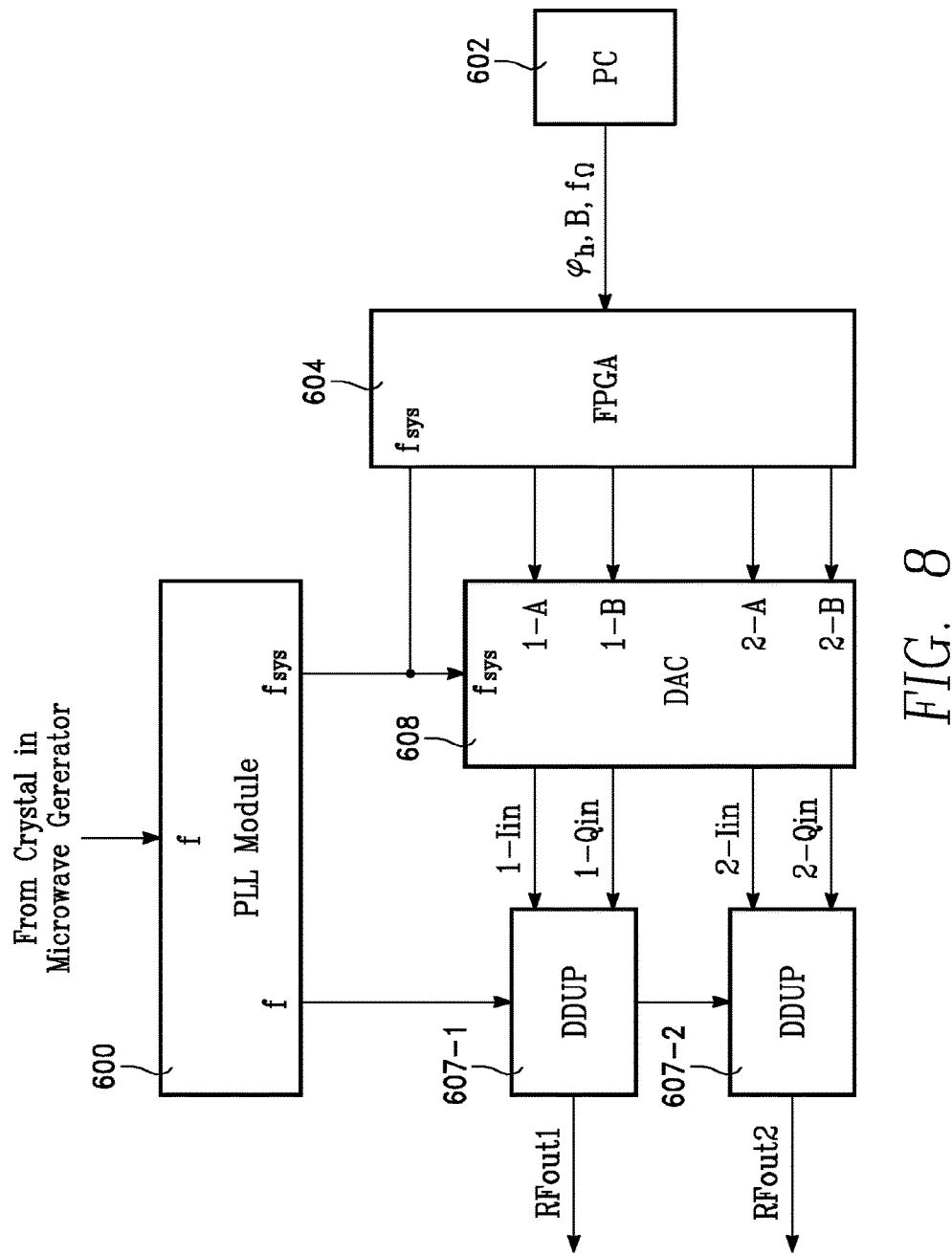
FIG. 8 is a block diagram of a system for generating a rotating microwave field using direct digital up-conversion.

Direct Digital Up-Conversion:

FIGS. 8 through 11 illustrate embodiments employing direct digital up-conversion (DDUP), in place of up-conversion from an intermediate frequency. In the embodiments of FIGS. 8 through 11, no conversion to an intermediate frequency is needed. What is now described is how to produce the microwave signals RFout1 and RFout2 which are fed to the cylindrical cavity 120 of FIG. 2 using direct digital up-conversion. The FPGA 604 of FIG. 8 is adapted to synthesize lower frequency digital signals from which the microwave field signals RFout1 and RFout2 are produced. In the embodiment of FIG. 8, the FPGA 604 can produce an in-phase digital component and a quadrature digital component of each lower frequency amplitude modulation signal. Each amplitude modulation signal is a precursor of the corresponding one of the microwave field signals RFout1 and RFout2.

In FIG. 8, the digital-to-analog converter (DAC) 608 converts low-frequency digital signals to analog signals. The DAC 608 has digital inputs 1-A, 1-B, 2-A and 2-B and analog outputs 1-Iin, 1-Qin, 2-Iin, and 2-Qin, respectively. The digital signals at the digital inputs 1-A, 1-B, 2-A and 2-B are converted to corresponding analog signals at the analog outputs 1-Iin, 1-Qin, 2-Iin, and 2-Qin, respectively.

The digital in-phase component corresponding to RFout1 corresponds to the digital input 1-A while the digital quadrature component corresponding to RFout1 corresponds to the digital input 1-B. Similarly, the digital in-phase component corresponding to RFout2 corresponds to the digital input 2-A while the digital quadrature component corresponding to RFout2 corresponds to the digital input 2-B.

Two DDUP integrated circuits (DDUP ICs) are employed to directly up-convert low-frequency amplitude modulation signals to a microwave carrier frequency $\omega$. The DDUP IC 607-1 combines the analog output 1-Iin with an in-phase component of the microwave frequency co to produce a first product. The DDUP IC 607-1 further combines the analog output 1-Qin with a quadrature component of the microwave frequency $\omega$, to produce a second product. The DDUP IC 607-1 adds the first and second products to produce the microwave signal RF1out.

Figure 8A:
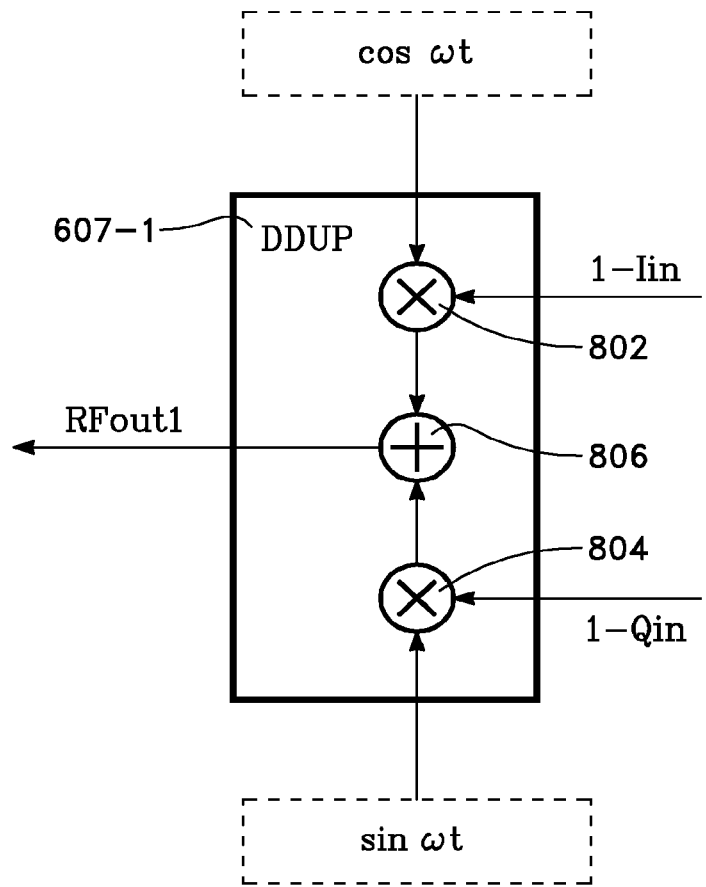
FIG. 8A is a simplified block diagram of a functionality common to DDUP IC's employed in the system of FIG. 8.

The DDUP IC 607-2 combines the analog output 2-Iin with an in-phase component of the microwave frequency co to produce a third product. The DDUP IC 607-2 combines the analog output 2-Qin with a quadrature component of the microwave frequency $\omega$, to produce a fourth product. The DDUP IC 607-2 adds the third and fourth products to produce the microwave signal RF2out. This functionality of each DDUP IC is illustrated in FIG. 8A, depicting a typical DDUP IC (e.g., the DDUP IC 607-1) as having a combining (mixer) function 802 for mixing the in-phase analog signal with the in-phase component of the microwave frequency, another combining function 804 for mixing the quadrature analog signal with the quadrature component of the microwave frequency, and an adder 806 for adding the two products from the mixer functions 802 and 804.

Figure 9:
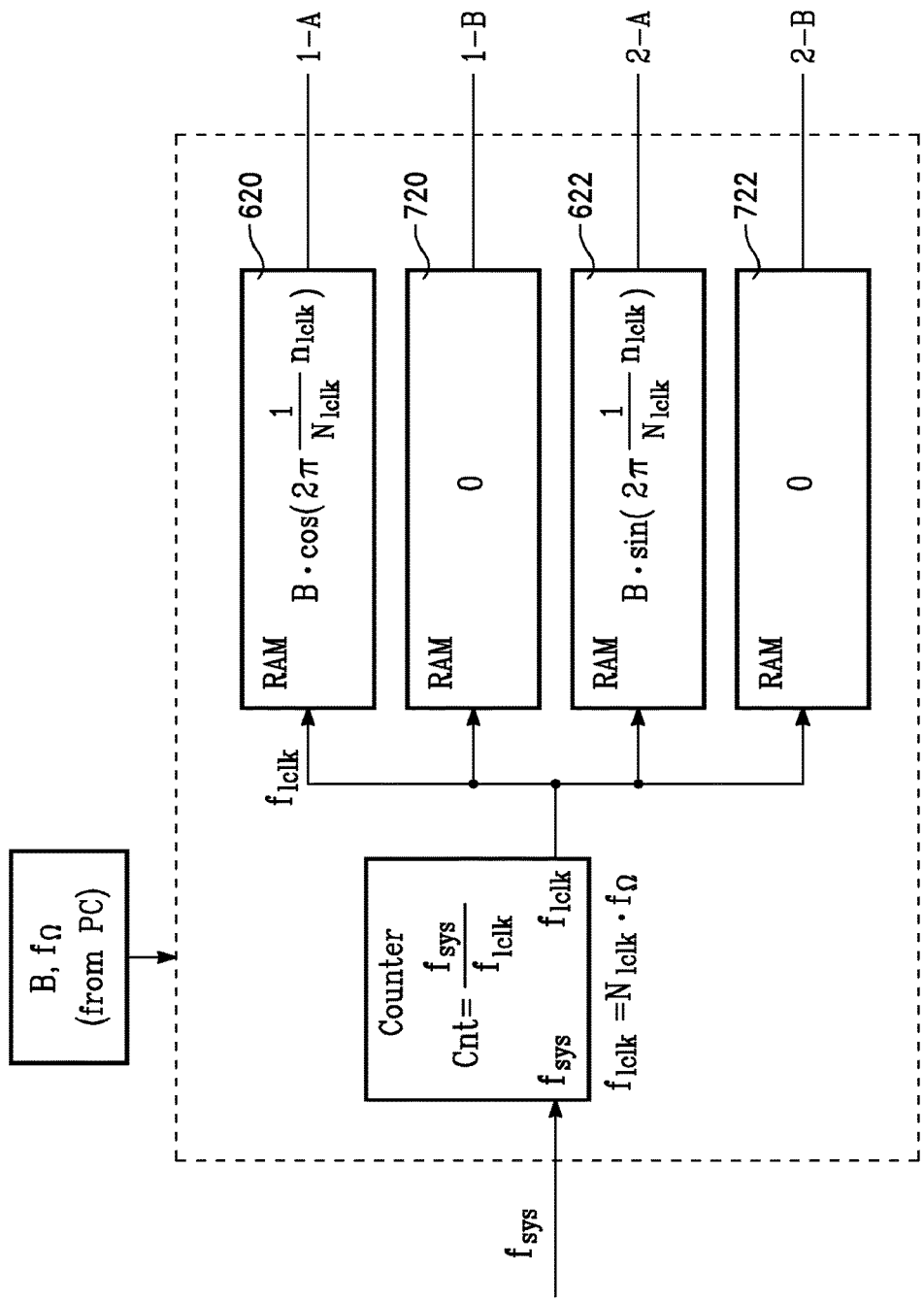
FIG. 9 is a block diagram of an FPGA of the system of FIG. 8 configured for amplitude modulation.

The FPGA 604 of FIG. 8 includes four random access memories (RAMs) 620, 720, 622 and 722 with outputs connected to respective ones of the four digital inputs 1-A, 1-B, 2-A and 2-B of the DAC 608, as shown in FIG. 9. FIG. 9 depicts one configuration of the FPGA 604 for implementing the mode of producing a slowly rotating microwave field by amplitude modulation.

In the mode of FIG. 9, the RAM 720 has zero content, so that no signal is applied to the digital input 1B of the DAC 608, while the RAM 722 has zero content so that no signal is applied to the digital input 2B of the DAC 608. In the mode of FIG. 9, the RAM 620 operates in the manner described above with reference to FIG. 4 to produce a digital in-phase component of an amplitude modulation signal $$B \cdot \cos\left(2\pi \frac{1}{N_{lclk}} n_{lclk}\right)$$

which is applied to the digital input 1A of the DAC 608. The DAC converts this signal to an analog amplitude modulation signal B cos $\Omega_a$t at the analog output 1-Iin. The DDUP IC 607-1 mixes the analog modulation signal B cos $\Omega_a$t with the microwave frequency in-phase component cos($\omega$t+$\varphi_h$) to produce the microwave signal RF1out as:

RFout1=$\alpha$B cos $\Omega_a t$ cos($\omega t$+$\varphi_h$), where $\alpha$ is a mixing-gain, $\Omega_a$ is the user-selected slow rotation frequency and w is the microwave frequency.

In the mode of FIG. 9, the RAM 622 operates in the manner described above with reference to FIG. 4 to produce a digital quadrature component of an amplitude modulation signal $$B \cdot \sin\left(2\pi \frac{1}{N_{lclk}} n_{lclk}\right)$$

which is applied to the digital input 2A of the DAC 608. The DAC 608 converts this signal to an analog amplitude modulation signal B sin $\Omega_a$t at the analog output 2-Qin. The DDUP IC 607-2 mixes the analog modulation signal B sin $\Omega_a$t with the microwave frequency in-phase component cos($\omega$t+$\varphi_h$) to produce the microwave signal RF2out as:

RFout2=$\alpha$B sin $\Omega_a t$ cos($\omega t$+$\varphi_h$), where $\alpha$ is a mixing-gain, $\Omega_a$ is the user-selected slow rotation frequency and $\omega$ is the microwave frequency.

Figure 10:
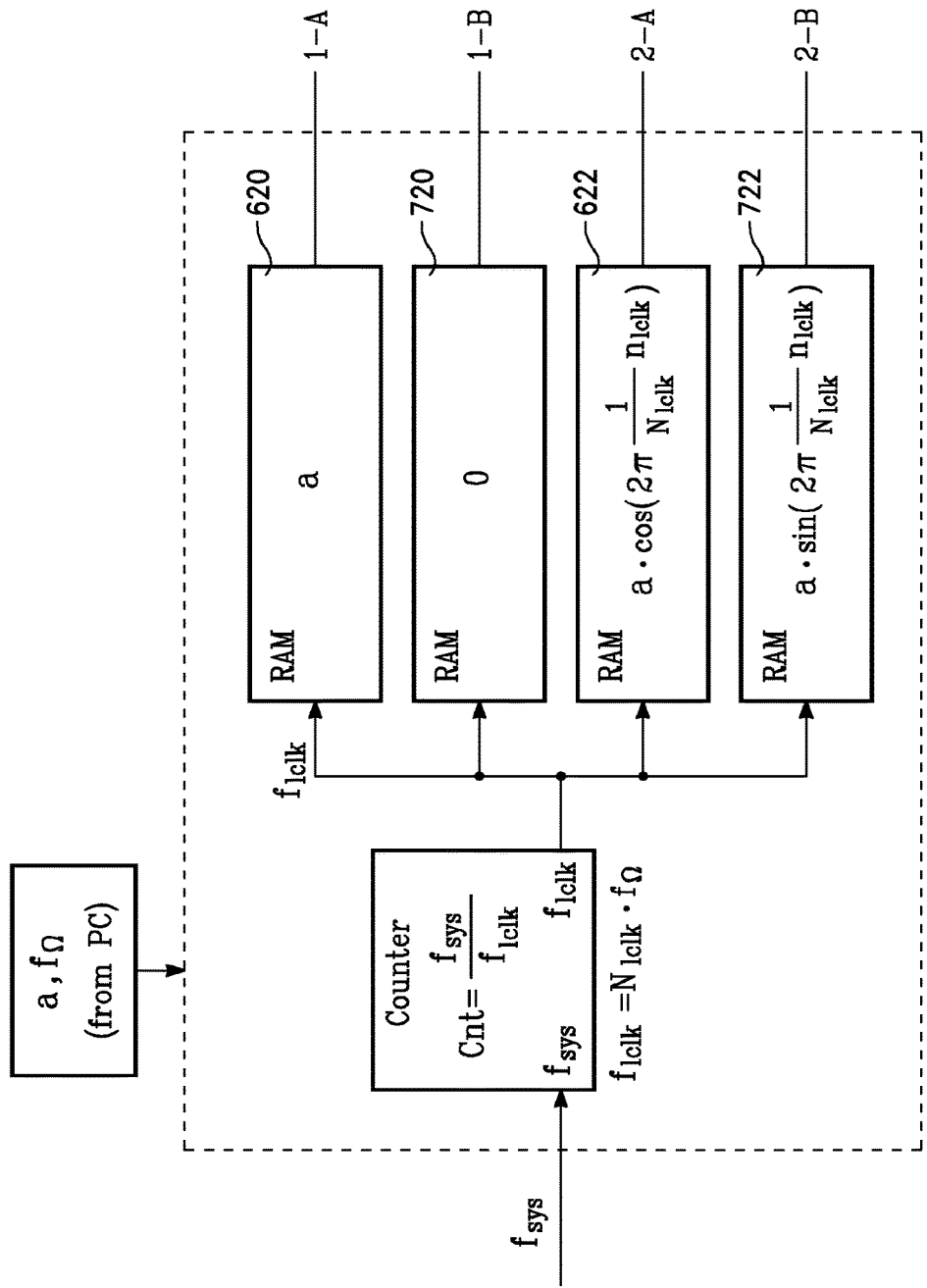
FIG. 10 is a block diagram of an FPGA of the system of FIG. 8 configured for phase modulation.

FIG. 10 depicts a configuration of the FPGA 604 for implementing the mode of producing a slowly rotating microwave field by a linear phase modulation. In the mode of FIG. 10, the RAM 620 provides a constant, a, to the digital input 1A of the DAC 608, which is transmitted to the analog output 1-Iin. The RAM 720 has zero content so that no signal is applied to the digital input 1B of the DAC 608 and no signal is present at the corresponding analog output 1-Qin of the DAC 608. In the mode of FIG. 10, the RAM 622 operates in the manner described above with reference to FIG. 4 to produce a digital in-phase component of an amplitude modulation signal $$a \cdot \cos\left(2\pi \frac{1}{N_{lclk}} n_{lclk}\right)$$

which is applied to the digital input 2A of the DAC 608. The DAC 608 converts this signal to an analog amplitude modulation signal $\alpha$ cos $\Omega_a$t at the analog output 2-Iin.

The RAM 722 produces a digital quadrature component of an amplitude modulation signal $$a \cdot \sin\left(2\pi \frac{1}{N_{lclk}} n_{lclk}\right)$$

which is applied to the digital input 2B of the DAC 608. The DAC 608 converts this signal to an analog amplitude modulation signal $\alpha$ sin $\Omega_a$t at the analog output 2-Qin.

The DDUP IC 607-1 mixes the constant, a, received from the output 1-Iin, with the microwave frequency in-phase component cos($\omega$t+$\varphi_h$) to produce the microwave signal RF1out as:

RFout1=$\alpha \cdot a$ cos($\omega t$+$\varphi_h$), where $\alpha$ is a mixing-gain, $\omega$ is the microwave frequency.

The DDUP IC 607-2 mixes the analog modulation signal a·cos $\Omega_a$t with the microwave frequency in-phase component cos($\omega$t+$\varphi_h$) to produce a first product signal $\alpha \cdot a$ cos $\Omega_a t$ cos($\omega t$+$\varphi_h$), where $\alpha$ is a mixing-gain, $\Omega_a$ is the user-selected slow rotation frequency and $\omega$ is the microwave frequency.

The DDUP IC 607-2 mixes the analog modulation signal a·sin $\Omega_a$t (present at the analog output 2-Qin) with the microwave frequency quadrature component sin($\omega$t+$\varphi_h$) to produce a second product signal $\alpha \cdot a$ sin $\Omega_a t$ sin($\omega t$+$\varphi_h$), where $\alpha$ is a mixing-gain, $\Omega_a$ is the user-selected slow rotation frequency and $\omega$ is the microwave frequency.

The DDUP IC 607-2 adds the first and second product signals to produce the microwave output signal RFout2 as RFout2=$\alpha \cdot$[cos $\Omega_a t$ cos($\omega t \varphi_h$)+cos $\Omega_a t$ cos($\omega t \varphi_h$)].

Figure 11:
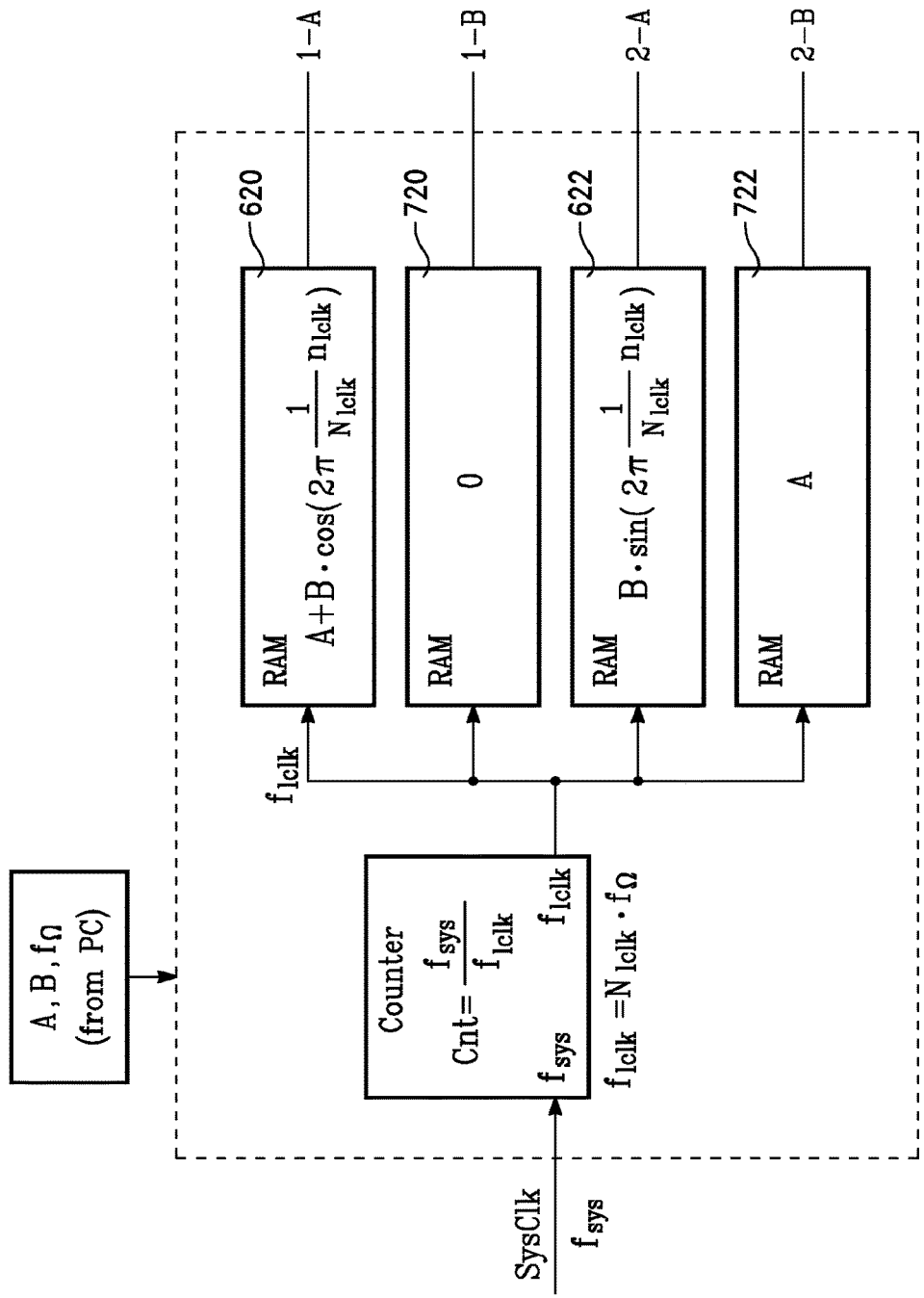
FIG. 11 is a block diagram of an FPGA of the system of FIG. 8 configured for simultaneous slow and fast rotational modes.

FIG. 11 depicts a configuration of the FPGA 604 for implementing a mode of producing fast and slow rotation of the microwave field at frequencies $\omega$ and $\Omega_a$, respectively. In the mode of FIG. 11, the RAM 620 provides the sum of a constant A with the digital in-phase component of an amplitude modulation signal, as $$A + B \cdot \cos\left(2\pi \frac{1}{N_{lclk}} n_{lclk}\right)$$

which is applied to the digital input 1A of the DAC 608. The DAC 608 converts this signal to an analog amplitude modulation signal A+B cos $\Omega_a$t at the analog output 1-Iin. The RAM 720 has zero content so that no signal is applied to the digital input 1B of the DAC 608 and no signal is present at the corresponding analog output 1-Qin of the DAC 608.

In the mode of FIG. 11, the RAM 622 produces a digital quadrature component of an amplitude modulation signal $$B \cdot \sin\left(2\pi \frac{1}{N_{lclk}} n_{lclk}\right)$$

which is applied to the digital input 2A of the DAC 608. The DAC 608 converts this signal to an analog amplitude modulation signal B sin $\Omega_a$t at the analog output 2-Iin. The RAM 722 outputs a constant, A, which is applied to the digital input 2B of the DAC 608 and is passed through to the analog output 2-Qin.

The DDUP IC 607-1 mixes the analog amplitude modulation signal A+B cos $\Omega_a$t at the analog output 1-Iin with the microwave frequency in-phase component cos($\omega$t+$\varphi_h$) to produce the microwave signal RF1out as:

RFout1=$\alpha$[A+B cos $\Omega_a t$]cos($\omega t$+$\varphi_h$)

where α is a mixing-gain, $\Omega_a$ is the user-selected slow rotation frequency and ω is the microwave frequency.

The DDUP IC 607-2 mixes the analog amplitude modulation signal B sin $\Omega_a$t at the analog output 2-Iin with the microwave frequency in-phase component cos(ωt+$\varphi_h$) to produce a first product signal α B sin $\Omega_a$t cos(ωt+$\varphi_h$), and where α is a mixing-gain.

The DDUP IC 607-2 mixes the constant A at the analog output 2-Qin with the microwave frequency quadrature component sin(ωt+$\varphi_h$) to produce a second product signal αA sin(ωt+$\varphi_h$), where α is a mixing-gain.

The DDUP IC 607-2 adds the first and second product signals together to produce the microwave output signal RF2out as:

$$RF2out=\alpha[B \cdot \sin \Omega_a t \cos(\omega t+\varphi_h)+A \cdot \sin(\omega t+\varphi_h)]$$

where α is a mixing-gain, $\Omega_a$ is the user-selected slow rotation frequency and ω is the microwave frequency.

The foregoing embodiments may be implemented by a computer (e.g., the computer 602) storing or accessing executable instructions for performing the function of an embodiment described above. The instructions may be accessed from a network or internet connection, from a disk or from other suitable media. By providing access by the computer to the executable instructions for performing the function or method, the computer is said to be programmed to perform the function or method.

Advantages:

Embodiments herein provide uniform processing results across a wide range of chamber pressures by rotating the microwave field of the plasma source. The microwave rotation is digitally synthesized so that the rotation frequency can be set as low as desired to enable the plasma to follow the rotation even at high chamber pressure.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
   a cylindrical microwave cavity overlying a workpiece processing chamber, and first and second coupling apertures in a sidewall of said cylindrical microwave cavity spaced apart by an angle;
   a system-controlling clock to generate a system clock signal; and
   a microwave source having a microwave frequency and comprising a microwave controller having respective microwave outputs coupled to respective ones of said first and second coupling apertures, said microwave controller including
      digital circuitry configured to receive the system clock signal and generate therefrom two digital outputs, at least one of the two digital outputs being a combination of a first component having a first frequency that is lower than the microwave frequency and a second component having a second frequency that is lower than the first frequency,
      a digital-to-analog converter coupled to said two digital outputs to generate two analog outputs corresponding to said two digital outputs, and
      an up-converter coupled to said two analog outputs to convert the two analog outputs to the microwave frequency to provide said microwave outputs.

2. The reactor of claim 1, wherein the digital circuitry is configured to generate first and second digital modulation signals at the second frequency and a first digital carrier signal at the first frequency.

3. The reactor of claim 2, wherein the digital circuitry includes a first multiplier to multiply the first digital carrier signal by the first digital modulation signal to generate a first of the two digital outputs.

4. The reactor of claim 3, wherein the digital circuitry includes a second multiplier to multiply the first digital carrier signal by the second digital modulation signal to generate a second of the two digital outputs.

5. The reactor of claim 2, wherein the digital circuitry is configured to generate a second digital carrier signal at the first frequency.

6. The reactor of claim 5, wherein the first digital carrier signal provides a first of the two digital outputs.

7. The reactor of claim 6, wherein the digital circuitry includes a first multiplier to multiply the first digital carrier signal by the first digital modulation signal, a second multiplier to multiply the second digital carrier signal by the second digital modulation signal, and an adder to add outputs of the first multiplier and the second multiplier to provide a second of the two digital outputs.

8. The reactor of claim 2, wherein the digital circuitry includes a first multiplier to multiply the first digital carrier signal by the first digital modulation signal, and a second multiplier to multiply the first digital carrier signal by a constant, and a first adder to add outputs of the first multiplier and the second multiplier to provide a first of the two digital outputs.

9. The reactor of claim 8, wherein the digital circuitry includes a third multiplier to multiply a second digital carrier signal by the second digital modulation signal, and a fourth multiplier to multiply the second digital carrier signal by the constant, and a second adder to add outputs of the third multiplier and the fourth multiplier to generate a second of the two digital outputs.

10. The reactor of claim 2, wherein said first and second digital modulation signals comprise, respectively, a cosine-form component I and a sine-form component Q.

11. The reactor of claim 10, wherein digital circuitry includes a first RAM containing successive samples of said cosine-form component I, a second RAM containing successive samples of said sine-form component Q, and a first clock pointer directed at the successive samples of I and Q in synchronism with said second frequency.

12. The reactor of claim 11, wherein said digital circuitry comprises a third RAM containing successive samples of said first digital carrier signal, and a second clock pointer directed at the successive samples of said digital carrier signal in synchronism with said first frequency.

13. The reactor of claim 1, wherein said angle is 90 degrees.

14. The reactor of claim 1, further comprising a user interface for allowing a user to specify said second frequency.

15. The reactor of claim 1, wherein the system-controlling clock includes a phase locked loop module to generate the system clock signal.

16. The reactor of claim 15, wherein the phase locked loop is configured to generate an up-conversion signal at an up-conversion frequency, and the up-converter receives the up-conversion signal.

* * * * *